US006596131B1

(12) United States Patent
Scott et al.

(10) Patent No.: US 6,596,131 B1
(45) Date of Patent: Jul. 22, 2003

(54) CARBON FIBER AND COPPER SUPPORT FOR PHYSICAL VAPOR DEPOSITION TARGET ASSEMBLY AND METHOD OF FORMING

(75) Inventors: Tim Scott, Post Falls, ID (US); Jianxing Li, Spokane, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/702,156

(22) Filed: Oct. 30, 2000

(51) Int. Cl.$^7$ .................. C23C 14/34; C22C 9/00; B23K 31/02
(52) U.S. Cl. .................. 204/192.12; 204/298.13; 228/228; 228/262.61; 420/469
(58) Field of Search .............. 204/298.12, 298.13; 228/228, 262.6, 262.61; 420/469

(56) References Cited

U.S. PATENT DOCUMENTS

| 5,043,049 | A | | 8/1991 | Takenaka | |
|---|---|---|---|---|---|
| 5,167,920 | A | | 12/1992 | Skibo et al. | |
| 5,397,050 | A | | 3/1995 | Mueller | |
| 5,693,203 | A | * | 12/1997 | Ohhashi et al. | ........ 204/298.12 |
| 6,183,686 | B1 | | 2/2001 | Bardus et al. | |

FOREIGN PATENT DOCUMENTS

| EP | 0223478 A2 | | 5/1987 | | |
|---|---|---|---|---|---|
| JP | 61 288 065 A | * | 12/1986 | ........... | 204/298.13 |
| JP | 62061056 | | 3/1987 | | |
| JP | 01062462 A | | 3/1989 | | |
| JP | 01083634 A | | 3/1989 | | |
| JP | 03196619 | | 8/1991 | | |
| JP | 07076771 | | 3/1995 | | |
| JP | 09137269 A | | 5/1997 | | |
| WO | WO 92/17622 | | 10/1992 | | |
| WO | WO 01/92594 A2 | | 12/2001 | | |
| WO | PCT/US01/45535 | | 8/2002 | | |

OTHER PUBLICATIONS

*CRC Handbook of Chemistry and Physics*: David R. Ilde, Editor–in–Chief; 80ry Edition 1999–2000, pp. 12–193, 12–206, 12–45–to 12–47; 12–194.

* cited by examiner

*Primary Examiner*—Patrick Ryan
*Assistant Examiner*—Gregg Cantelmo
(74) *Attorney, Agent, or Firm*—Wells St. John P.S.

(57) ABSTRACT

The invention includes a method of forming an assembly of a physical vapor deposition target and support. A physical vapor deposition target is provided. The physical vapor deposition target has a coefficient of thermal expansion of less than $10 \times 10^{-6} K^{-1}$. The physical vapor deposition target is joined to a support. The support comprises a thermal coefficient of expansion of less than $11 \times 10^{-6} K^{-1}$. The invention also includes an assembly comprising a physical vapor deposition target and a support joined to the physical vapor deposition target. The support comprises carbon fibers and copper.

34 Claims, 6 Drawing Sheets

CARBON FIBER AND COPPER SUPPORT FOR PHYSICAL VAPOR DEPOSITION TARGET ASSEMBLY AND METHOD OF FORMING

TECHNICAL FIELD

The invention pertains to physical vapor deposition target assemblies and methods of forming physical vapor deposition target assemblies. In particular applications, the invention pertains to physical vapor deposition target assemblies comprising a physical vapor deposition target joined to a support comprising carbon fibers dispersed in a metal matrix.

BACKGROUND OF THE INVENTION

Physical vapor deposition targets have wide application in fabrication processes where thin films are desired, and include, for example, sputtering targets. An exemplary application for physical vapor deposition processes, such as, for example, sputtering processes, is in semiconductor processing applications for forming thin films across semiconductor substrates.

A physical vapor deposition target can comprise any of numerous metallic elements and alloys, or can comprise ceramic materials. In operation, a physical vapor deposition target is exposed to ions or atoms which impact a surface of the target and are utilized to eject material from the physical vapor deposition target surface toward a substrate. The ejected material lands on the substrate to form a thin film over the substrate. The ejected material is typically displaced from the sputtering surface in the form of small, discrete pieces comprising a few atoms or less of target material. The pieces are generally desired to be uniform in size and composition relative to one another. However, problems can occur in which some the ejected material is in the form of "particles" or "splats". The terms "particle" and "splat" refer to chunks of ejected material that are much larger than the average size of the pieces ejected from the sputtering surface. The particles can adversely affect properties of a film deposited from a target, and accordingly it is generally desired to reduce particle generation. Particle generation can be particularly severe when there is a large thermal stress in the target arising from large differences of thermal expansion coefficient between the target and the backing plate, and from high temperature due to high power deposition.

Physical vapor deposition targets are retained in a chamber or other apparatus during a deposition process, and problems can occur in fabricating the targets for such retention. One method of retaining a physical vapor deposition target within an apparatus is to first mount the target to a so-called backing plate. The backing plate is configured to connect the target to the apparatus, and preferably comprises an electrical conductivity which is equal to or greater than the material of the target so that the backing plate does not impede electrical or magnetic flow from the apparatus through the target. A common material utilized for backing plate constructions is copper. The backing plate can be mounted to a target by, for example, bonding the backing plate and target together with solder.

The backing plate will generally comprise a different material than the target, and accordingly will have different physical properties. Among the physical properties which can differ from a backing plate to a target is the coefficient of thermal expansion. If a target has a significantly different coefficient of thermal expansion than a backing plate associated with the target, there can be significant strain introduced at a bond formed between the backing plate and target. Such strain can fatigue the bond and eventually result in separation of the target from the backing plate. Among the targets which can be particularly problematic are targets comprising tungsten, such as targets which consist essentially of, or consist of tungsten; as well as targets which comprise a significant amount of tungsten (i.e., greater than 50 atom % tungsten), such as targets comprising, consisting essentially of, or consisting of tungsten and titanium. The coefficient of thermal expansion for tungsten is $4.5 \times 10^{-6} K^{-1}$, whereas the coefficient of thermal expansion for copper is $16.5 \times 10^{-6} K^{-1}$. Accordingly, targets comprising a substantial amount of tungsten have significantly different coefficients of thermal expansion than backing plates comprising copper.

Tungsten and tungsten/titanium compositions have applications in semiconductor processing methodologies as, for example, conductive plugs and Al barrier materials. Accordingly, an effort has been made to develop methodologies for physical vapor deposition of tungsten and tungsten/titanium, and specifically an effort has been made to develop methodologies for bonding tungsten-containing targets with copper-containing backing plates. One of the methodologies which has been developed is to utilize a relatively soft solder, such as, for example, a solder comprising indium, to bond the target to the backing plate. The soft solder can then expand and contract to create a flexible bond between the target and backing plate. A difficulty with utilizing indium-containing solders is that the solders have a melting point of about 170° C., and can lose structural integrity at temperatures of about 80° C. or above. It is common for targets to heat to temperatures of 80° C. or above during a sputtering operation, and such can cause the indium-solder bond between the target and backing plate to fail. The failure can cause target separation from the backing plate, and in particularly problematic cases, can cause a target to fall from a backing plate during a physical vapor deposition operation. Also, it can be desired to heat a target to temperatures significantly above 80° C. to reduce particle generation during a sputtering operation. Physical vapor deposition processes which are operated only at the relatively cold temperatures at which indium-based solders are stable can be particularly problematic relative to particle generation.

In light of the above-discussed problems, it is desirable to develop new methodologies for retaining physical vapor deposition targets in physical vapor deposition apparatuses, and particularly it is desirable to develop new backing plates and new techniques for mounting physical vapor deposition targets to backing plates.

SUMMARY OF THE INVENTION

In one aspect, the invention encompasses a method of forming an assembly of a physical vapor deposition target and support. A physical vapor deposition target is provided. The physical vapor deposition target has a coefficient of thermal expansion of less than $10 \times 10^{-6} K^{-1}$. The physical vapor deposition target is joined to a support. The support has a thermal coefficient of expansion of less than $11 \times 10^{-6} K^{-1}$.

In another aspect, the invention encompasses an assembly comprising a physical vapor deposition target and a support joined to the physical vapor deposition target. The support comprises carbon fibers and copper.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

The invention encompasses methodology for forming a support structure having a thermal coefficient of expansion which is approximately matched to the thermal coefficient of expansion of a material supported by the support structure, and preferably having a coefficient of expansion within ±10% of the coefficient of expansion of the material that is being supported. In particular embodiments, the invention encompasses methods of forming a backing plate having a coefficient of thermal expansion approximately matched to the coefficient of thermal expansion of a physical vapor deposition target supported by the backing plate. The backing plate can be formed from a mixture of copper and carbon fibers, and the coefficient of thermal expansion of the backing plate can be determined by the relative proportion of carbon fibers to copper in the mixture. Accordingly, the coefficient of thermal expansion of the backing plate can be adjusted relative to a particular target which is to be supported by the backing plate.

As discussed above in the "Background" section of this disclosure, a target material which can be particularly problematic to support in sputtering applications is tungsten, due to the low coefficient of thermal expansion of a tungsten material. Methodology of the present invention can be utilized to form a backing plate having high conductivity, and having a coefficient of thermal expansion approximately matching that of a tungsten material. It is to be understood that methodology of the present invention can be utilized for supporting other target materials besides tungsten-containing materials. Methodology of the present invention can be particularly useful in forming backing plates or other support structures for supporting physical vapor deposition targets having coefficients of thermal expansion less than $10 \times 10^{-6} K^{-1}$, and/or comprising relatively brittle materials. Accordingly, methodology of the present invention can be particularly useful for forming support structures for tungsten-containing physical vapor deposition targets, and also can be particularly useful for forming support structures for ceramic physical vapor deposition target materials, such as, for example, target materials comprising lead, zirconate, and titanate (i.e, so-called PZT compositions).

It is to be understood that even though the invention is described herein with reference to illustrations describing applications of the invention for bonding backing plate structures to physical vapor deposition targets, the present invention can be applied to other applications wherein it is desired to support a material with a support structure having a coefficient of thermal expansion approximately equal to that of the material which is being supported.

Figure 1:
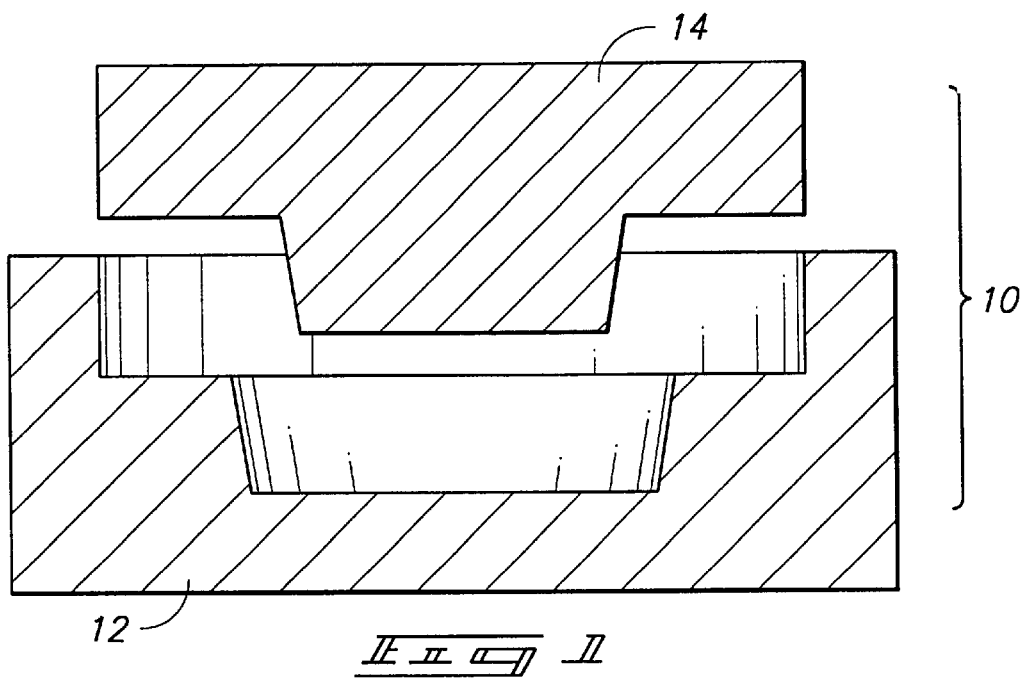
FIG. 1 is a diagrammatic, cross-sectional view of a pressing apparatus that can be utilized in methodology of the present invention.

An exemplary method of the present invention is described with reference to FIGS. 1–5. Referring initially to FIG. 1, a molding apparatus 10 (also referred to herein as a pressing apparatus) is provided. Apparatus 10 comprises a bottom portion 12 and an upper portion 14. Portions 12 and 14 can be formed of, for example, graphite so that materials pressed within the molding apparatus do not stick to the molding apparatus. Alternatively, portions 12 and 14 can comprise metallic constructions coated with graphite. Ultimately, portions 12 and 14 will be subjected to pressures of several thousand pounds per square inch, and accordingly portions 12 and 14 are preferably constructed of materials configured to withstand such pressures.

Portions 12 and 14 are shaped to form a desired support structure from a material pressed between portions 12 and 14. The illustrated shape of portions 12 and 14 is an exemplary shape only, and it is to be understood that portions 12 and 14 can be formed in other shapes.

Figure 2:
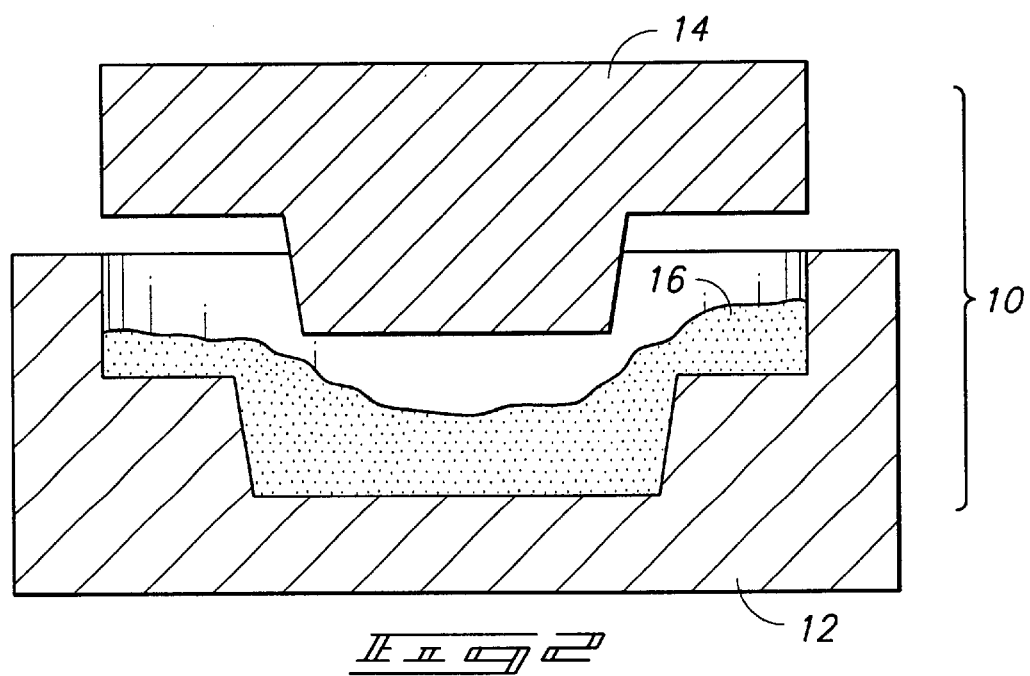
FIG. 2 is a view of the FIG. 1 apparatus shown at a processing step subsequent to that of FIG. 1, and shown with a material provided within the apparatus.

Referring next to FIG. 2, a mixture 16 is provided between portions 12 and 14. Mixture 16 preferably comprises carbon fibers dispersed within a metal matrix. The mixture can comprise, for example, copper and carbon fibers, with the relative proportion of copper to carbon fibers being chosen to ultimately form a material with a desired coefficient of thermal expansion. Exemplary carbon fibers can comprise dimensions of lengths of from about 50 microns to about 10 millimeters, and diameters (or thicknesses if the fibers have non-circular cross-sections) of from about 1 micron to about 15 microns. The carbon fibers will preferably be provided to a concentration of less than about 50% (by volume) within mixture 16 so that desired conductive properties of copper are retained by mixture 16. In some embodiments, copper can be provided in mixture 16 to a concentration of greater than or equal to about 50%, by volume. Mixture 16 can consist essentially of carbon fibers and copper, and in particular embodiments can consist of carbon fibers and copper. In other embodiments, mixture 16 can comprise materials in addition to copper and carbon fibers, such as, for example, silicon, aluminum, nickel, silver, chrome, and molybdenum. An exemplary composition of mixture 16 is from about 40% to about 90% copper (by volume), and from about 10% to about 60% carbon fibers (by volume). In applications in which it is desired to form a support structure having a coefficient of thermal expansion approximately equal to that of tungsten (i.e. approximately equal to $4.5 \times 10^{-6} K^{-1}$), a suitable composition can comprise from about 49% to about 51% copper (by volume), and from about 49% to about 51% carbon fibers (by volume). As the volume-percent of carbon fiber increases, the coefficient of thermal expansion for a material comprising the carbon fibers dispersed in a metal matrix will decrease. For instance, if carbon fibers are dispersed in a copper metal matrix the resulting material will have a coefficient of thermal expansion of about $14 \times 10^{-6} K^{-1}$ at 10 volume-percent carbon fiber, and a coefficient of thermal expansion of about $4.6 \times 10^{-6} K^{-1}$ at 50 volume-percent carbon fiber. A final density of a material comprising carbon fibers dispersed in copper or copper alloy can be greater than or equal to about 98% of the theoretical density.

Figure 3:
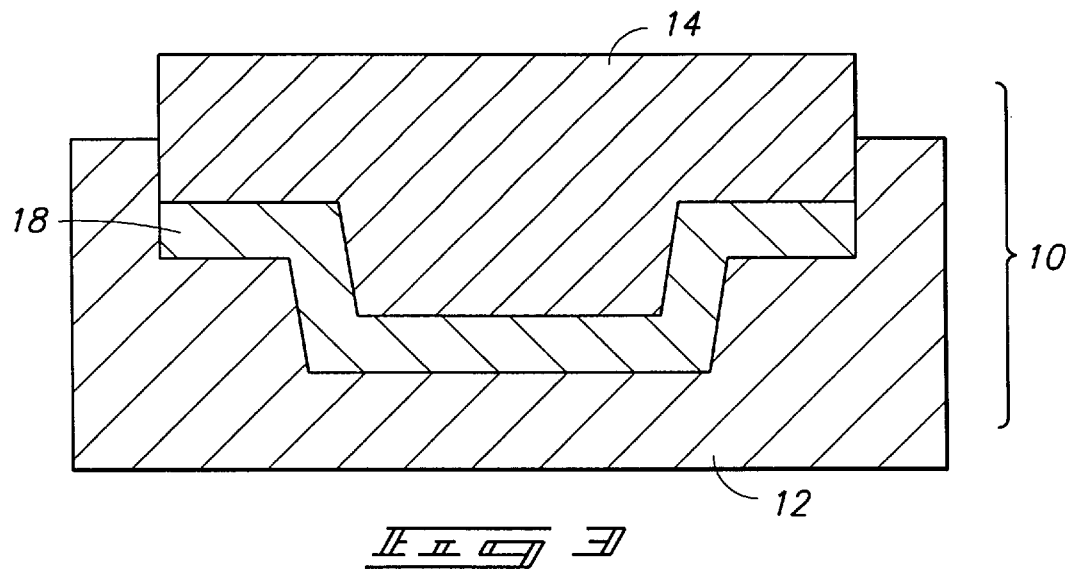
FIG. 3 is a view of the FIG. 1 apparatus shown at a processing step subsequent to that of FIG. 2, and shown after compressing the material within the apparatus to form a physical vapor deposition target support.

Referring to FIG. 3, upper portion 14 and lower portion 12 of pressing apparatus 10 are displaced relative to one another to compress mixture 16 (FIG. 2) between them and form a support structure 18 from the powdered mixture 16 (FIG. 2). Upper portion 14 and lower portion 12 can be displaced relative to one another by, for example, providing a power source (not shown) connected to one or both of upper portion 14 and lower portion 12 to move upper portion 14 toward lower portion 12 and/or to move lower portion 12 toward upper portion 14. Portions 12 and 14 are preferably displaced to compress mixture 16 (FIG. 2) to a pressure of at least 4,000 psi while maintaining a temperature of mixture 16 below a melting temperature of copper (1,084° C.); with suitable processing temperatures being from about 800° C. to about 1000° C., and suitable processing pressures being from about 4000 psi to about 6000 psi. A reason for maintaining a temperature of mixture 16 below a melting temperature of copper is that if the copper melts it can pool and separate from the carbon fibers within mixture 16.

The pressure and temperature imparted against powder 16 causes solid diffusion of metallic components within the powder (e.g., copper) and convert powder 16 to a rigid solid material 18 without actually melting the metallic components of powder 16.

In an exemplary application, powder 16 is compressed to a pressure of at least about 4,000 psi while maintaining a temperature of the mixture below about 1,000° C., and more preferably while maintaining a temperature of the mixture below about 900° C. The compression of mixture 16 is preferably maintained for a time of at least about one hour to allow substantially complete solid diffusion to occur within powder 16 and thus form the support structure 18 of FIG. 3. A preferred compression of mixture 16 can be at a pressure of at least about 4,000 psi and a temperature of from about 875° C. to about 1,000° C. for a time sufficient to cause plastic deformation of metallic components of mixture 16 and thus form metallic support structure 18.

Figure 4:
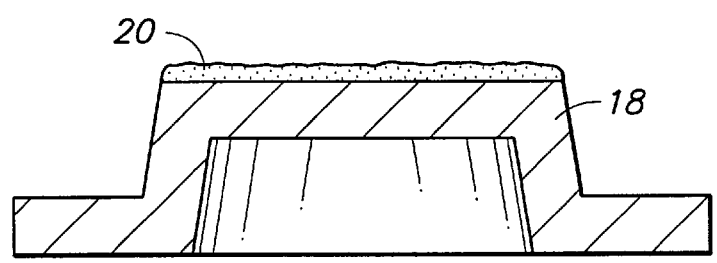
FIG. 4 is a diagrammatic, cross-sectional view of the physical vapor deposition target support formed in FIG. 3, and shown in an inverted configuration relative to the configuration of FIG. 3. Also shown in FIG. 4 is a solder material provided on top of the support.

Referring to FIG. 4, support structure 18 is shown removed from apparatus 10 (FIG. 3) and inverted relative to the configuration of support 18 in FIG. 3. Support 18 can have a configuration of a physical vapor deposition target backing plate, and can, for example, have a round outer periphery (visible in the top view of FIG. 6) typical of an "Endura" backing plate structure.

A solder 20 is shown provided over an upper surface of support structure 18. Since support structure 18 can have a coefficient of thermal expansion configured to approximately match the coefficient of thermal expansion of a target that is ultimately to be bonded to structure 18, solder 20 can comprise a relatively hard solder, rather than the soft solders traditionally used in prior art processes. For instance, solder 20 can comprise a silver, copper, and/or tin based material, and can, for example, be a brazing material. Such can enable the problems described in the "Background" section of this disclosure to be avoided because the hard solders can have higher melting temperatures than the soft indium-based solders described in the "Background" section.

Figure 5:
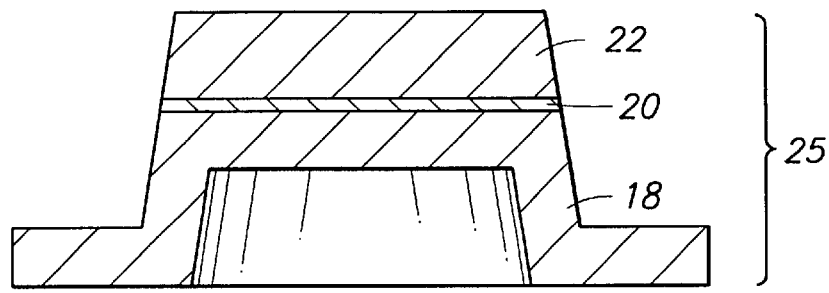
FIG. 5 is a diagrammatic, cross-sectional view of the support of FIG. 4 shown at a processing step subsequent to that of FIG. 4, and shown with a physical vapor deposition target bonded to the support.
Figure 6:
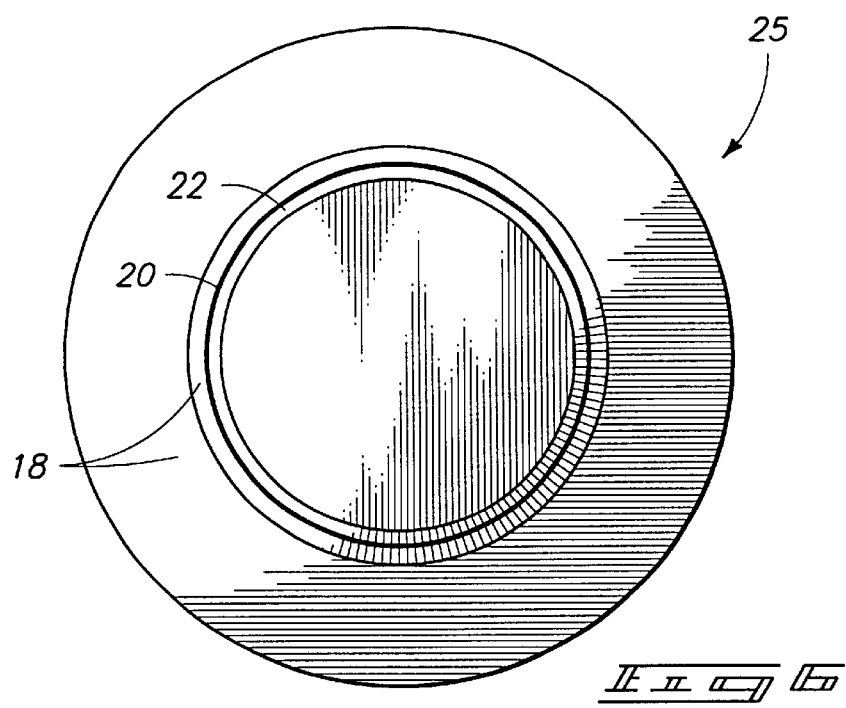
FIG. 6 is a top view of the FIG. 5 support.

Referring next to FIG. 5, a physical vapor deposition target 22 is mounted to support structure 18 by joining target 22 to solder 20. The target, support structure and solder together define an assembly 25. Target 22 can comprise, for example, a tungsten material. If target 22 comprises a tungsten material, backing plate 18 can comprise a copper/carbon fiber matrix having a coefficient of thermal expansion configured to approximately match that of the tungsten material. Backing plate 18 and target 22 can comprise any of numerous configurations, with the shown configuration being an exemplary configuration. Backing plate 18 and target 22 can comprise, for example, an "Endura" configuration, and accordingly can comprise a round outer periphery. FIG. 6 shows exemplary structure 5 in a top-view, and illustrates the exemplary round outer periphery configuration.

Methodology of the present invention can be useful for attaching support structures (such as, for example, backing plates) to physical vapor deposition targets in any application wherein a physical vapor deposition target has a coefficient of thermal expansion of less than about $10 \times 10^{-6} K^{-1}$, and wherein it is desired to attach a backing plate having a coefficient of thermal expansion approximately equal to that of the target.

Methodology of the present invention can further be utilized to match a coefficient of thermal expansion of a backing plate to that of a physical vapor deposition target while keeping an electrical conductivity of the backing plate greater than or equal to the electrical conductivity of the target.

Exemplary backing plates of the present invention can comprise copper and carbon fibers, and can have electrical conductivity's approximating that of copper (with copper having a resistivity of about $1.67 \times 10^{-8}$ ohm-meter). Such exemplary backing plates can also have coefficients of thermal expansion significantly less than that of pure copper (with pure copper having a coefficient of thermal expansion of about $16.5 \times 10^{-6} K^{-1}$). Accordingly, methodology of the present invention can be utilized for forming a support structure 18 having an electrical conductivity greater than that of a tungsten target (with tungsten having an electrical resistivity of $4.82 \times 10^{-8}$ ohm—meter), while having a coefficient of thermal expansion less than that of copper. In particular embodiments of the present invention, both a physical vapor deposition target 22 and a support structure 18 will have a coefficient of thermal expansion below $11 \times 10^{-6} K^{-1}$, in further embodiments both will have a coefficient of thermal expansion less than $6 \times 10^{-6} K^{-1}$, and in further embodiments both will have a coefficient of thermal expansion below $5\times10^{-6}K^{-1}$. In an exemplary embodiment, physical vapor deposition target 22 can consist of tungsten, and accordingly have a coefficient of thermal expansion of about $4.5\times10^{-6}K^{-1}$. In such exemplary embodiment, support structure 18 can be formed to also have a coefficient of thermal expansion less than $5\times10^{-6}K^{-1}$, and preferably of about $4.5\times10^{-6}K^{-1}$.

It is noted that target 22 can comprise other materials in addition to, or alternatively to tungsten. Target 22 can, for example, comprise a non-metallic material, such as, for example, a ceramic material. In particular embodiments, target 22 can comprise any ceramic material having a coefficient of thermal expansion less than or equal to $10\times10^{-6}K^{-1}$. Alternatively, target 22 can comprise, consist essentially of, or consist of a metallic material, such as, for example, one or more of tantalum (which has a coefficient of thermal expansion of about $6.5\times10^{-6}K^{-1}$), molybdenum (which has a coefficient of thermal expansion of about $5\times10^{-6}K^{-1}$), and zirconium (which has a coefficient of thermal expansion of about $6\times10^{-6}K^{-1}$). In yet other embodiments, target 22 can comprise, consist essentially of, or consist of silicon (which has a coefficient of thermal expansion of about $2.5\times10^{-6}K^{-1}$), germanium (which has a coefficient of thermal expansion of about $5.7\times10^{-6}K^{-1}$), or metallic compositions with silicon and/or germanium (e.g., silicides).

In exemplary embodiments, target 22 comprises mixtures of tungsten with titanium or other elements. Such mixtures can comprise, for example, at least 50 atom % tungsten. In the prior art, mixtures comprising concentrations of tungsten of at least 50 atom % would be difficult to utilize as physical vapor deposition targets due to difficulty of target fabrication and particle generation during deposition. Specifically, it would be difficult to compensate for the significant variation between the thermal coefficient of expansion of such mixtures and the thermal coefficient of expansion of a backing plate having suitable electrical conductivity and thermal conductivity, such as, for example, a backing plate comprising copper. Methodology of the present invention can avoid such prior art problems by forming a backing plate having a coefficient of thermal expansion approximately matched to that of the target.

Figure 7:
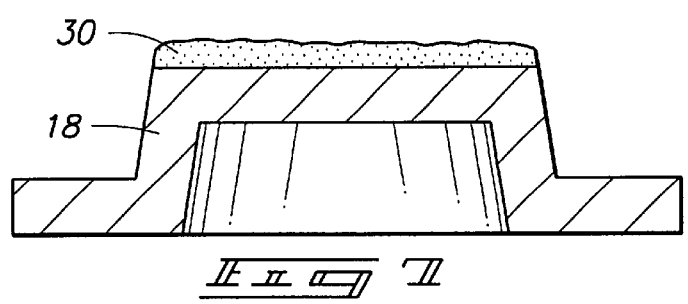
FIG. 7 is a diagrammatic cross-sectional view of the support formed in FIG. 3, and shown in an inverted configuration relative to that of FIG. 3. Also shown in FIG. 7 is a bonding material provided on top of the support.
Figure 8:
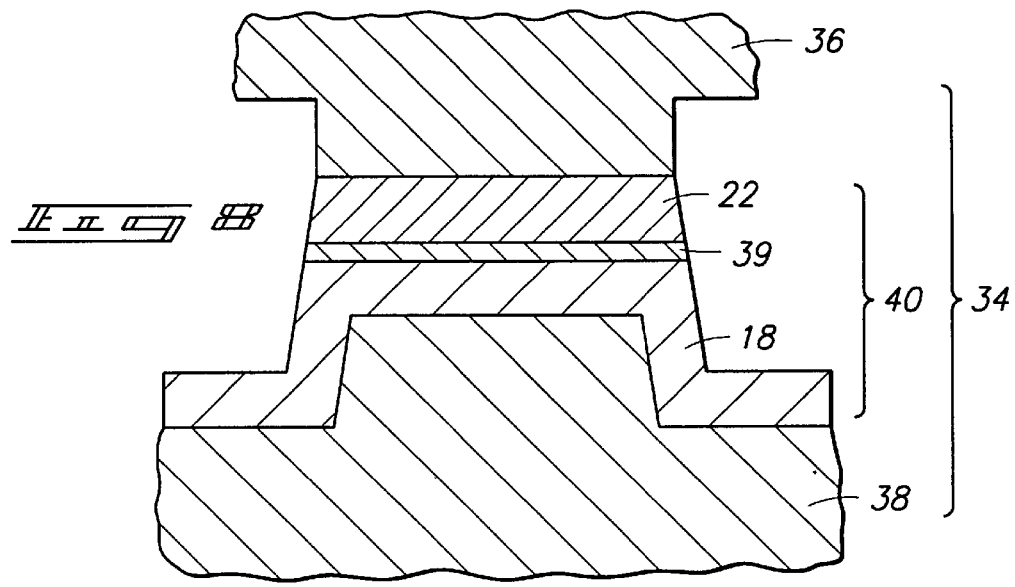
FIG. 8 is a diagrammatic, cross-sectional view of the support of FIG. 7 provided within a press, and shown with a physical vapor deposition target over the bonding material and pressed against the bonding material.
Figure 9:
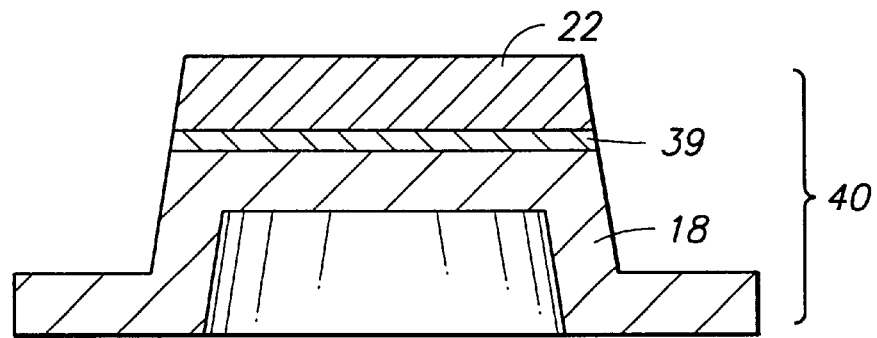
FIG. 9 is a diagrammatic, cross-sectional view of a physical vapor deposition target assembly formed utilizing the processing of FIG. 8, and shown in an inverted configuration relative to the configuration illustrated in FIG. 8.

FIGS. 7–9 illustrate an alternative embodiment of the present invention. Referring first to FIG. 7, support structure 18 is shown in a view similar to that of FIG. 4. However, a difference between FIG. 7 and FIG. 4 is that the solder layer 20 of FIG. 4 is replaced with a metal matrix composite (MMC) mixture comprising, for example, carbon fibers dispersed in a copper powder, with the MMC mixture labeled as 30. Mixture 30 can be considered as a second mixture of carbon fibers and copper relative to the first mixture 16 (FIG. 2) utilized in forming backing plate 18.

Referring to FIG. 8, a physical vapor deposition target 22 is provided over MMC mixture 30 (FIG. 7), and then a press 34 comprising an upper press component 36 and lower press component 38 is utilized to compress mixture 30 (FIG. 7) between target 22 and support 18 to form a bonding layer 39. Press 34 can comprise a power source (not shown) configured to displace components 36 and 38 toward one another, and accordingly configured to press mixture 30 (FIG. 7) between support 18 and target 22. In particular embodiments, mixture 30 will comprise carbon fibers dispersed in a copper powder, and will be compressed under conditions similar to those discussed above regarding FIG. 3. Such compression can cause solid diffusion throughout the metallic components of mixture 30 (FIG. 7), and can accordingly form a solid metallic material 39 from mixture 30.

Support 18, solid bonding layer 39 and target 22 define an assembly 40. Such assembly is shown in FIG. 9 after being removed from press 34. An advantage of the assembly 40 of FIG. 9 relative to the assembly 25 of FIG. 5 can be that MMC bonding layer 39 can be stronger than solder bonding layer 20. Accordingly, target 22 can be more rigidly held to support 18 in assembly 40 of FIG. 9 than in assembly 25 of FIG. 5. A disadvantage of the assembly 40 of FIG. 9 relative to the assembly 25 of FIG. 5 can be that it is more difficult to remove target 22 from the assembly of FIG. 9 to enable recycling of support structure 18. Specifically, targets eventually wear out during a sputtering operation. It is typically desired to reuse a backing plate after an associated target has worn out. The assembly of FIG. 5 can enable easy reuse of backing plate 18 by simply heating assembly 25 to a temperature at which solder 20 melts, to enable removal of target 22. In contrast, it can be difficult to remove target 22 from assembly 40 without cutting through bonding layer 39 to remove the target. Once bonding layer 39 has been cut, it can be difficult to restore appropriate dimensions to backing plate 18 which would enable reuse of backing plate 18.

Figure 10:
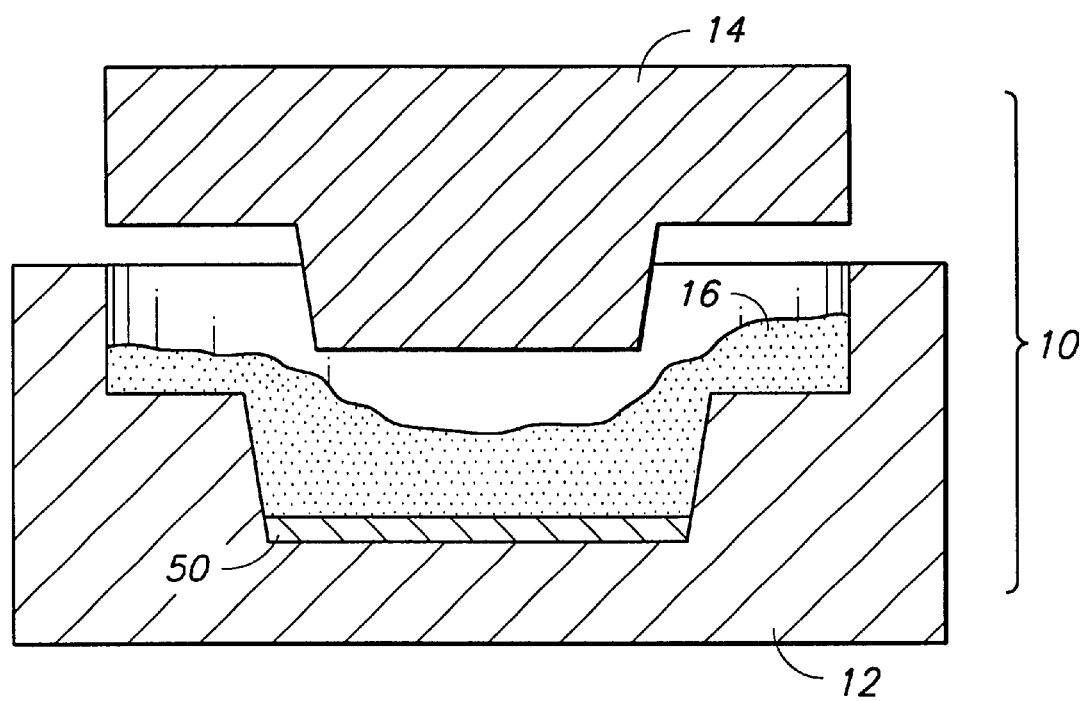
FIG. 10 is a diagrammatic, cross-sectional view of the FIG. 1 mold having a physical vapor deposition target provided therein and having a powdered mixture provided over the physical vapor deposition target.

Another embodiment of the present invention is described with reference to FIGS. 10–12. Referring initially to FIG. 10, the assembly 10 of FIG. 1 is illustrated in a view similar to that of FIG. 2. However, a difference between FIG. 10 and FIG. 2 is that a physical vapor deposition target 50 has been provided within lower mold portion 12 of apparatus 10 prior to provision of powder 16 within the apparatus. Physical vapor deposition target 50 can comprise, for example, tungsten, either alone, or in combination with other materials, such as, for example, titanium. Alternatively, target 50 can comprise a ceramic material. Powder 16 can comprise the compositions described previously with reference to FIG. 2, and can comprise, for example, a mixture of carbon fibers and copper.

Figure 11:
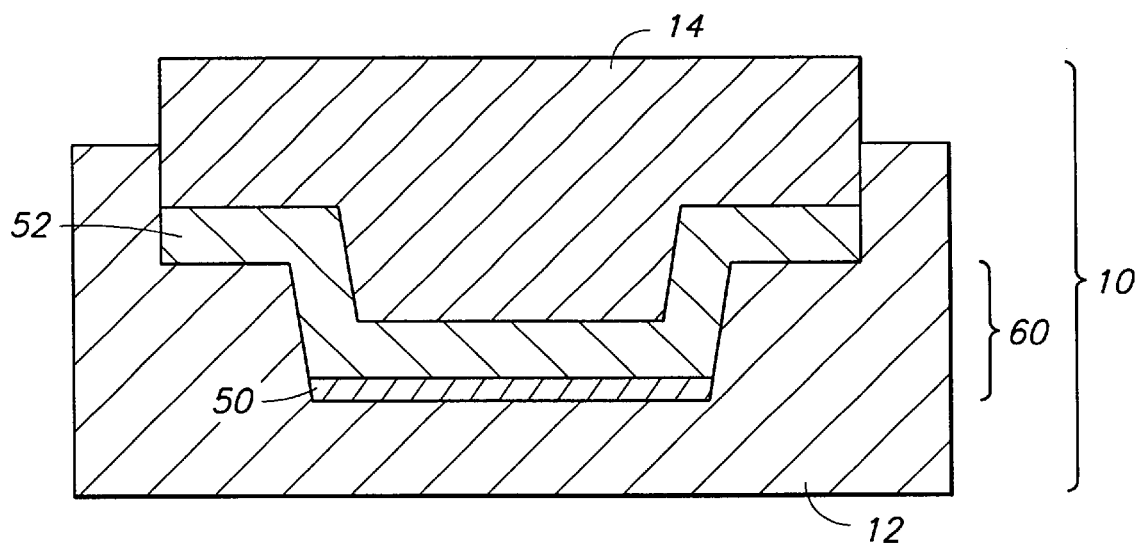
FIG. 11 is a view of the FIG. 10 apparatus shown at a processing step subsequent to that of FIG. 10, and shown with the powdered mixture compressed into a support structure.
Figure 12:
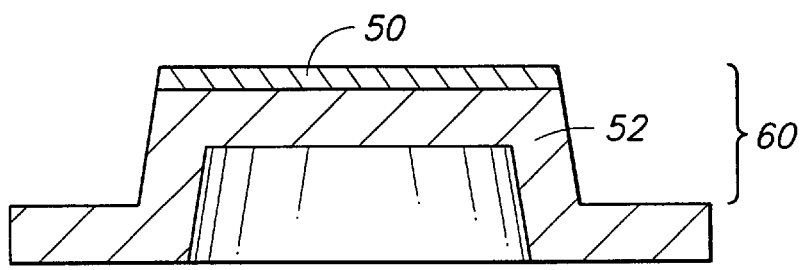
FIG. 12 is a view of a physical vapor deposition target assembly formed in accordance with the methodology of FIGS. 10 and 11, and comprising the physical vapor deposition target and support structure of FIG. 11 shown in an inverted view relative to that of FIG. 11.

Referring to FIG. 11, apparatus 10 is utilized to compress powder 16 (FIG. 10) and form a metallic support structure 52 joined to physical vapor deposition target 50. The compression of powder 16 (FIG. 10) to form support structure 52 can comprise conditions similar to, or identical to, the conditions described previously with reference to the compression shown in FIG. 3. Metallic support structure 52 and physical vapor deposition target 50 together define an assembly 60. Such assembly is shown in FIG. 12 in isolation from apparatus 10, and inverted relative to the configuration of FIG. 11. A difference between the assembly 60 of FIG. 12 and assemblies 25 and 40 of FIGS. 5 and 9, respectively, is that physical vapor deposition target 50 is in physical contact with support structure 52 in the assembly of FIG. 12. An advantage in forming the assembly of FIG. 12 relative to forming assemblies 25 and 40 is that there can be fewer processing steps utilized in forming assembly 60. A disadvantage of assembly 60 can be that it is more difficult to recycle support structure 52 of assembly 60 after target 50 has worn out than it is to recycle support structures 18 of assemblies 25 and 40. Specifically, it can be difficult to remove a used target from over support structure 52 of assembly 60 without cutting into the support structure, and accordingly changing the support structure dimensions.

Figure 13:
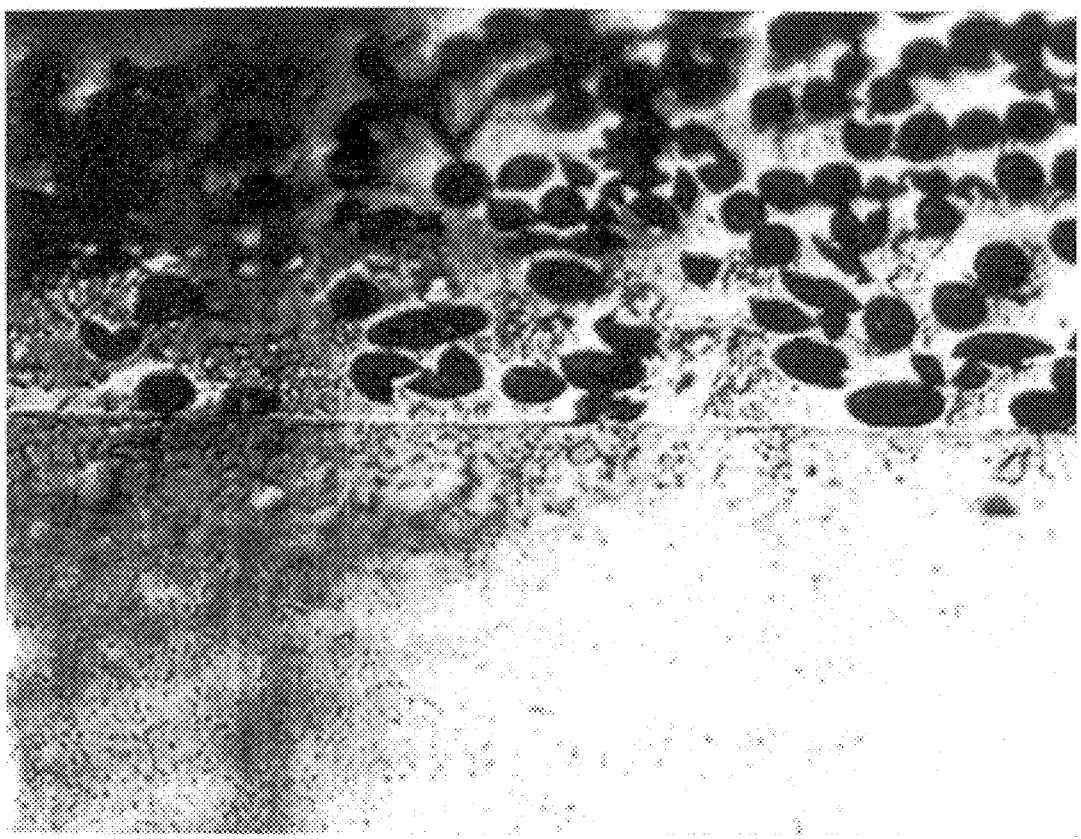
FIG. 13 is a photograph of a copper/carbon fiber support structure bonded to a tungsten target in accordance with a methodology of the present invention. The copper/carbon support is shown at the top of the photograph, and the tungsten target is shown at the bottom of the photograph.

Methodology of the present invention can enable a uniform and uninterrupted interface to be formed between a tungsten-containing physical vapor deposition target and a support structure. An exemplary interface is shown in the photograph of FIG. 13. Specifically, FIG. 13 shows a copper/carbon fiber matrix support structure bonded to a tungsten target in accordance with a method of the present invention. The copper/carbon fiber support structure is shown in about the top half of the photograph of FIG. 13, and the tungsten target comprises about the bottom half of the photograph of FIG. 13. An interface is shown between the support structure and the target, and is shown to be uniform and uninterrupted, in that there is no separation between the target and the support structure. The uniform and uninterrupted interface can be important in maintaining uniform electrical and magnetic conductivity through the support structure and into the target during a sputtering operation. Accordingly, methodology of the present invention can be utilized for forming physical vapor deposition target/backing plate assemblies wherein there is uniform electrical field and magnetic field permeation through the backing plate and into the physical vapor deposition target during a sputtering operation.

Methods of the present invention can be utilized to enable physical vapor deposition targets comprising tungsten or tungsten/titanium to be bonded to backing plates and utilized at higher processing temperatures than previous assemblies comprising tungsten or tungsten/titanium targets and backing plates. Such can lower particle generation relative to prior art assemblies, and accordingly improve semiconductor devices formed utilizing target assemblies of the present invention relative to devices formed utilizing prior art target assemblies.

What is claimed is:

1. A method of forming an assembly of a physical vapor deposition target and support, comprising:
   providing a physical vapor deposition target having a coefficient of thermal expansion of less than $10 \times 10^{-6} K^{-1}$, wherein the physical vapor deposition target comprises tungsten;
   joining the physical vapor deposition target to a support comprising a metal matrix with carbon fibers dispersed therein, the joining comprising joining with a bonding layer comprising carbon fibers and metal; and
   wherein the support has a coefficient of thermal expansion of less than $11 \times 10^{-6} K^{-1}$.

2. The method of claim 1 wherein the support comprises a greater electrical conductivity than the physical vapor deposition target.

3. The method of claim 1 wherein the support comprises at least 50% copper, by volume.

4. The method of claim 1 wherein the support comprises copper and the carbon fibers.

5. The method of claim 1 wherein:
   the support comprises copper and the carbon fibers;
   the physical vapor deposition target comprises at least 50% tungsten, by weight; and
   the coefficient of thermal expansion of the support and the coefficient of thermal expansion of the physical vapor deposition target are both below $7 \times 10^{-6} K^{-1}$.

6. The method of claim 5 wherein the coefficient of thermal expansion of the support and the coefficient of thermal expansion of the physical vapor deposition target are both below $6 \times 10^{-6} K^{-1}$.

7. The method of claim 5 wherein the coefficient of thermal expansion of the support and the coefficient of thermal expansion of the physical vapor deposition target are both below $5 \times 10^{-6} K^{-1}$.

8. The method of claim 5 wherein the physical vapor deposition target consists essentially of tungsten, and wherein the coefficient of thermal expansion of the support and the coefficient of thermal expansion of the physical vapor deposition target are both below $5 \times 10^{-6} K^{-1}$.

9. A method of forming an assembly of a physical vapor deposition target and support, comprising:
   forming a support by compressing a mixture comprising copper powder and carbon fibers;
   providing a physical vapor deposition target; and
   joining the physical vapor deposition target to the support utilizing a bonding material comprising carbon fibers.

10. The method of claim 9 wherein the compressing comprises compressing the mixture to a pressure of at least about 3000 psi while maintaining a temperature of the mixture below a melting temperature of the copper.

11. The method of claim 9 wherein the compressing comprises compressing the mixture to a pressure of at least about 4000 psi while maintaining a temperature of the mixture below about 1000° C.

12. The method of claim 9 wherein the compressing comprises compressing the mixture to a pressure of at least about 4000 psi while maintaining a temperature of the mixture below about 900° C.

13. The method of claim 9 wherein the physical vapor deposition target comprises a ceramic material.

14. The method of claim 9 wherein the physical vapor deposition target comprises a metallic material.

15. The method of claim 9 wherein the physical vapor deposition target comprises tungsten.

16. The method of claim 9 wherein the physical vapor deposition target comprises molybdenum.

17. The method of claim 9 wherein the physical vapor deposition target comprises zirconium.

18. The method of claim 9 wherein the physical vapor deposition target comprises silicon.

19. The method of claim 9 wherein the physical vapor deposition target comprises germanium.

20. The method of claim 9 wherein the physical vapor deposition target comprises tungsten and titanium.

21. The method of claim 9 wherein the physical vapor deposition target consists essentially of tungsten.

22. The method of claim 9 wherein the physical vapor deposition target consists of tungsten.

23. A method of forming an assembly of a physical vapor deposition target and support, comprising:
   providing a physical vapor deposition target;
   forming a support by compressing a first mixture comprising carbon fibers and copper powder;
   joining the physical vapor deposition target to the support; and wherein
   the joining occurs after forming the support; and
   the joining comprises joining the support to the physical vapor deposition target with a second mixture of carbon fibers and copper.

24. A method of forming an assembly of a physical vapor deposition target and support, comprising:
   providing a physical vapor deposition target;
   forming a support by compressing a first mixture comprising carbon fibers and copper powder;
   joining the physical vapor deposition target to the support; and wherein
   the joining occurs while forming the support; and
   the joining comprises joining the support to the physical vapor deposition target; and
   the compressing comprises compressing the physical vapor deposition target against the mixture of carbon fibers and copper.

25. A method of forming a physical vapor deposition target and support, comprising:
   providing a physical vapor deposition target having a coefficient of thermal expansion of less than $10 \times 10^{-6} K^{-1}$;

joining the physical vapor deposition target to a support utilizing a bonding material comprising carbon fibers, the support being formed by solid diffusion to form a rigid material comprising a metal matrix with carbon fibers dispersed therein, the carbon fibers having lengths from about 50 microns to about 10 millimeters; and wherein the support has a coefficient of thermal expansion of less than $11 \times 10^{-6} K^{-1}$.

26. The method of claim 25 wherein the physical vapor deposition target comprises zirconium.

27. The method of claim 25 wherein the physical vapor deposition target comprises germanium.

28. The method of claim 25 wherein the physical vapor deposition target comprises tungsten.

29. A method of forming an assembly of a physical vapor deposition target and support, comprising:

providing a physical vapor deposition target having a coefficient of thermal expansion of less than $10 \times 10^{-6} K^{-1}$; and joining the physical vapor deposition target to a support comprising a metal matrix with carbon fibers dispersed therein, the joining comprising joining with a bonding layer comprising carbon fibers and metal, the support having a coefficient of thermal expansion of less than $11 \times 10^{-6} K^{-1}$.

30. The method of claim 29 wherein the physical vapor deposition target comprises tantalum.

31. The method of claim 29 wherein the physical vapor deposition target comprises molybdenum.

32. The method of claim 29 wherein the physical vapor deposition target comprises zirconium.

33. The method of claim 29 wherein the physical vapor deposition target comprises silicon.

34. The method of claim 29 wherein the physical vapor deposition target comprises germanium.

* * * * *

UNITED STATES PATENT AND TRADEMARK OFFICE
CERTIFICATE OF CORRECTION

PATENT NO. : 6,596,131 B1
DATED : July 22, 2003
INVENTOR(S) : Scott et al.

It is certified that error appears in the above-identified patent and that said Letters Patent is hereby corrected as shown below:

Column 1,
Line 37, insert -- of -- after "some".

Column 9,
Line 38, replace "$11 \times 10^{-}K^{-1}$" with -- $11 \times 10^{-6}K^{-1}$ --.

Column 10,
Line 67, replace "$_6K^{-1}$" with -- $^6K^{-1}$ --.

Signed and Sealed this

Fourth Day of November, 2003

JAMES E. ROGAN
*Director of the United States Patent and Trademark Office*